US007391825B2

(12) United States Patent
Bhattacharya et al.

(10) Patent No.: US 7,391,825 B2
(45) Date of Patent: Jun. 24, 2008

(54) COMPARATOR CIRCUIT HAVING REDUCED PULSE WIDTH DISTORTION

(75) Inventors: Dipankar Bhattacharya, Macungie, PA (US); Makeshwar Kothandaraman, Whitehall, PA (US); John C. Kriz, Palmerton, PA (US); Bernard L. Morris, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 552 days.

(21) Appl. No.: 11/046,995

(22) Filed: Jan. 31, 2005

(65) Prior Publication Data

US 2006/0170461 A1 Aug. 3, 2006

(51) Int. Cl.
*H04B 10/06* (2006.01)

(52) U.S. Cl. ..................................................... 375/318

(58) Field of Classification Search ................ 375/316, 375/317, 318; 330/252, 256; 327/52, 83, 327/89, 96, 127, 246, 266, 274, 280, 287, 327/359; 326/32, 33, 50

See application file for complete search history.

(56) References Cited

U.S. PATENT DOCUMENTS 6,313,662 B1 * 11/2001 Ide .............................. 326/83
6,970,043 B2 * 11/2005 Pradhan et al. ............. 330/253
7,184,478 B2 * 2/2007 Popescu et al. ............. 375/233
7,190,742 B2 * 3/2007 Popescu et al. ............. 375/326
2001/0040466 A1 * 11/2001 Ide .............................. 326/83

OTHER PUBLICATIONS

Carvajal et al. Low-power Low-voltage differential class-AB OTAs for SC circuits, Electronic Letters, Oct. 24, 2002, vol. 38, No. 22, p. 1304-1305.*

You et al. On the Common Mode Rejection Ratio in Low Voltage Operational Amplifiers with Complementary N-P Input Pairs, 1997 IEEE, p. 678-683.*

* cited by examiner

*Primary Examiner*—Sam K Ahn
(74) *Attorney, Agent, or Firm*—Ryan, Mason & Lewis, LLP

(57) ABSTRACT

A comparator circuit having reduced pulse width distortion includes a differential amplifier operative to receive at least first and second signals and to amplify a difference between the first and second signals. The differential amplifier generates a difference signal at an output thereof which is a function of the difference between the first and second signals. An output stage is included in the comparator circuit for receiving the difference signal and for generating an output signal of the comparator circuit, the output signal being representative of the difference signal, the output stage having a switching point associated therewith. The comparator circuit further includes a voltage source coupled to the output of the differential amplifier. The voltage source is operative to generate a reference signal for establishing a common-mode voltage of the difference signal generated by the differential amplifier. The reference signal is substantially centered about the switching point of the output stage and substantially tracks the switching point over variations in process, voltage and/or temperature conditions to which the comparator circuit is subjected.

20 Claims, 2 Drawing Sheets

100
102
104
106
VDDIO
I0
I1
N5
N6
N7
N9
N10
M1
M2
M3
M4
M5
M6
M7
M8
M9
NEG
POS
Z
VSS
G
S
D 200
202
203
204
206
208
210
212
214
INV1
INV2
INV3
VDDIO
VSS
IO
N5
N6
N7
N8
N9
N10
VCM
R1
M1
M2
M3
M4
M5
M6
M7
M8
M9
M10
M11
M12
M13
M14
NEG
POS
IDDQ
IDDQN
Z

COMPARATOR CIRCUIT HAVING REDUCED PULSE WIDTH DISTORTION

FIELD OF THE INVENTION

The present invention relates generally to electronic circuits, and more particularly relates to techniques for reducing pulse width distortion in a comparator circuit.

BACKGROUND OF THE INVENTION

Comparators are well known in the art. A comparator is a circuit which compares one input signal with at least another input signal and outputs a binary signal based on the result of the comparison. In the case of an analog comparator, the two or more input signals to be compared are generally analog in nature. What is meant here by an analog signal is one that can have one of a continuum of amplitude values at any given point in time. In many applications, it is desirable to provide a binary output signal indicating when an input signal is above or below a predefined reference level. In this scenario, a substantially fixed reference voltage is applied to one of the inputs of the comparator, and the other input of the comparator receives the input signal to be compared. The output signal generated by the comparator will be a binary signal representing whether the input signal is greater than or less than the reference voltage level.

Certain input/output (I/O) interface applications, including, for example, gunning transistor logic (GTL), high-speed transceiver logic (HSTL), and series stub terminated logic (SSTL), require comparator circuits which compare an input signal against a reference signal in order to recover transmitted data carried in the input signal. In such comparator circuits, it is generally necessary to have a substantially low pulse width distortion over a desired range of process, voltage and/or temperature (PVT) variations to which the comparator circuits may be subjected in order to reliably recover the data without errors and with adequate margin.

One known method for reducing pulse width distortion in a comparator is to increase a tail current in a differential amplifier of the comparator. Increasing the tail current in the differential amplifier serves, at least in part, to increase a slew rate of the amplifier, thereby reducing the amount of time that the amplifier spends in a switching region of a logic stage which may be coupled to an output of the amplifier. However, increasing the tail current also increases overall power consumption in the comparator and is thus undesirable. Known comparator circuit arrangements inherently lack a mechanism for controlling a signal swing of the output of the differential amplifier so that the output is substantially centered around a switching point of a logic stage which may be connected to the amplifier. Furthermore, a large signal swing on the output of the differential amplifier can often result in an increase in the amount of jitter at the comparator output induced by the differential amplifier.

A need exists, therefore, for an improved comparator circuit having reduced pulse width distortion, which does not suffer from one or more of the problems exhibited by conventional comparator circuits.

SUMMARY OF THE INVENTION

The present invention meets the above-noted need by providing, in an illustrative embodiment, an improved comparator circuit configured to reduce pulse width distortion induced, at least in part, through a differential amplifier of the comparator circuit over a desired range of PVT variations to which the comparator circuit may be subjected. Moreover, the improved comparator circuit advantageously reduces pulse width distortion without significantly increasing power consumption in the comparator circuit.

In accordance with one aspect of the invention, a comparator circuit having reduced pulse width distortion includes a differential amplifier operative to receive at least first and second signals and to amplify a difference between the first and second signals. The differential amplifier generates a difference signal at an output thereof which is a function of the difference between the first and second signals. An output stage is included in the comparator circuit for receiving the difference signal and for generating an output signal of the comparator circuit, the output signal being representative of the difference signal, the output stage having a switching point associated therewith. The comparator circuit further includes a voltage source coupled to the output of the differential amplifier. The voltage source is operative to generate a reference signal for establishing a common-mode voltage of the difference signal generated by the differential amplifier. The reference signal is substantially centered about the switching point of the output stage and substantially tracks the switching point over variations in process, voltage and/or temperature conditions to which the comparator circuit is subjected.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative comparator circuit. It should be understood, however, that the present invention is not limited to this or any particular comparator circuit arrangements. Rather, the invention is more generally applicable to techniques for reducing pulse width distortion in a comparator circuit, without significantly increasing power consumption in the circuit. Furthermore, although implementations of the present invention are described herein with specific reference to n-type metal-oxide semiconductor (NMOS) transistor devices and p-type metal-oxide semiconductor (PMOS) transistor devices, as may be formed using a complementary metal-oxide semiconductor (CMOS) fabrication process, it is to be appreciated that the invention is not limited to such transistor devices and/or to such a fabrication process, and that other suitable devices, such as, for example, bipolar junction transistors, etc., and/or fabrication processes (e.g., bipolar, BiCMOS, etc.), may be similarly employed, with or without modification to the circuit shown, as will be understood by those skilled in the art.

Figure 1:
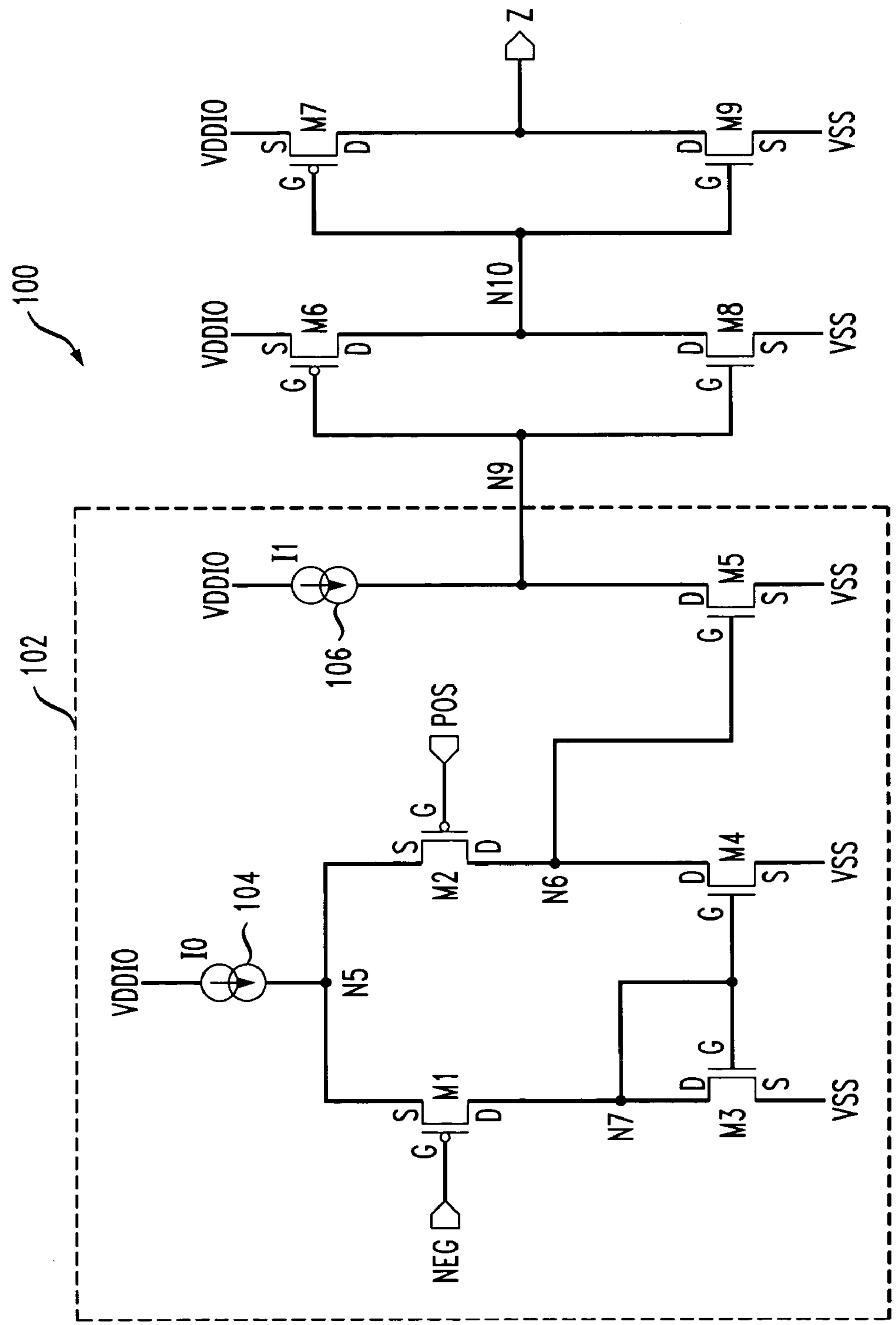
FIG. 1 is a schematic diagram depicting a conventional comparator circuit.

FIG. 1 is a schematic diagram illustrating a conventional comparator 100. The comparator 100 comprises a differential amplifier 102 having a first input (NEG), a second input (POS), and an output at node N9. The differential amplifier 102 may be a conventional two-stage amplifier. A first stage, which is an input stage, of the amplifier 102 includes a pair of PMOS transistors M1 and M2 coupled to a load, each of the transistors M1, M2 having a source terminal (S), drain terminal (D) and gate terminal (G). The source terminals of M1 and M2 are connected together to form a common source node N5. Gate terminals of M1 and M2 and connected to the inputs NEG and POS, respectively, of the differential amplifier 102. The drain terminals of M1 and M2 are connected to a pair of NMOS transistors M3 and M4, respectively, which form a simple current mirror serving as the load. Specifically, drain and gate terminals of transistor M3 are connected to the drain terminal of transistor M1 at node N7, a gate terminal of transistor M4 is connected to the gate terminal of M3, and a drain terminal of M4 is connected to the drain terminal of transistor M2 at node N6. Source terminals of transistors M3 and M4 are connected to VSS, which may be ground. A current source 104 is connected to node N5 at a first end and to a positive supply voltage VDDIO at a second end for supplying bias current 10 to the input stage.

The differential amplifier 102 further includes a second stage, which is an output stage, comprising a current source 106 connected between VDDIO and the output node N9, and an NMOS pull-down transistor M5 having a drain terminal connected to node N9, a gate terminal connected to an output of the input stage at node N6, and a source terminal connected to VSS. The current source 106 supplies a current 11 for biasing the output stage, which is configured for class-A operation, to a desired quiescent point.

The differential amplifier 102 may drive one or more subsequent inverter stages which function primarily to provide a substantially rail-to-rail output signal. The illustrative comparator circuit 100 includes first and second inverter stages. The first inverter stage comprises a PMOS transistor M6 and an NMOS transistor M8 connected in a conventional inverter fashion. Likewise, the second inverter stage comprises PMOS transistor M7 and NMOS transistor M9 connected in a conventional inverter manner. An input of the first inverter stage is connected to the output of the differential amplifier 102 at node N9, an output of the first inverter stage is connected to an input of the second inverter stage at node N10, and an output of the second inverter stage forms an output Z of the comparator circuit 100.

One disadvantage of the standard comparator circuit 100 is that a voltage at node N6 of the differential amplifier 102 is not well controlled. Node N6 is a high impedance node that connects two transistor devices, M2 and M4, which typically operate in saturation. The nominal operating voltage at node N6 when the POS and NEG inputs are at the same potential will be defined primarily by current sourcing and sinking capabilities of the input and load devices, namely, M1, M2, M3 and M4. This voltage is subject to mismatches between PMOS and NMOS device characteristics. Furthermore, the voltage at node N6 does not accurately track the switching point of the first and second inverter stages over variations in PVT conditions of the comparator circuit 100. These voltage mismatches are a primary source of pulse width distortion in the comparator circuit 100.

Figure 2:
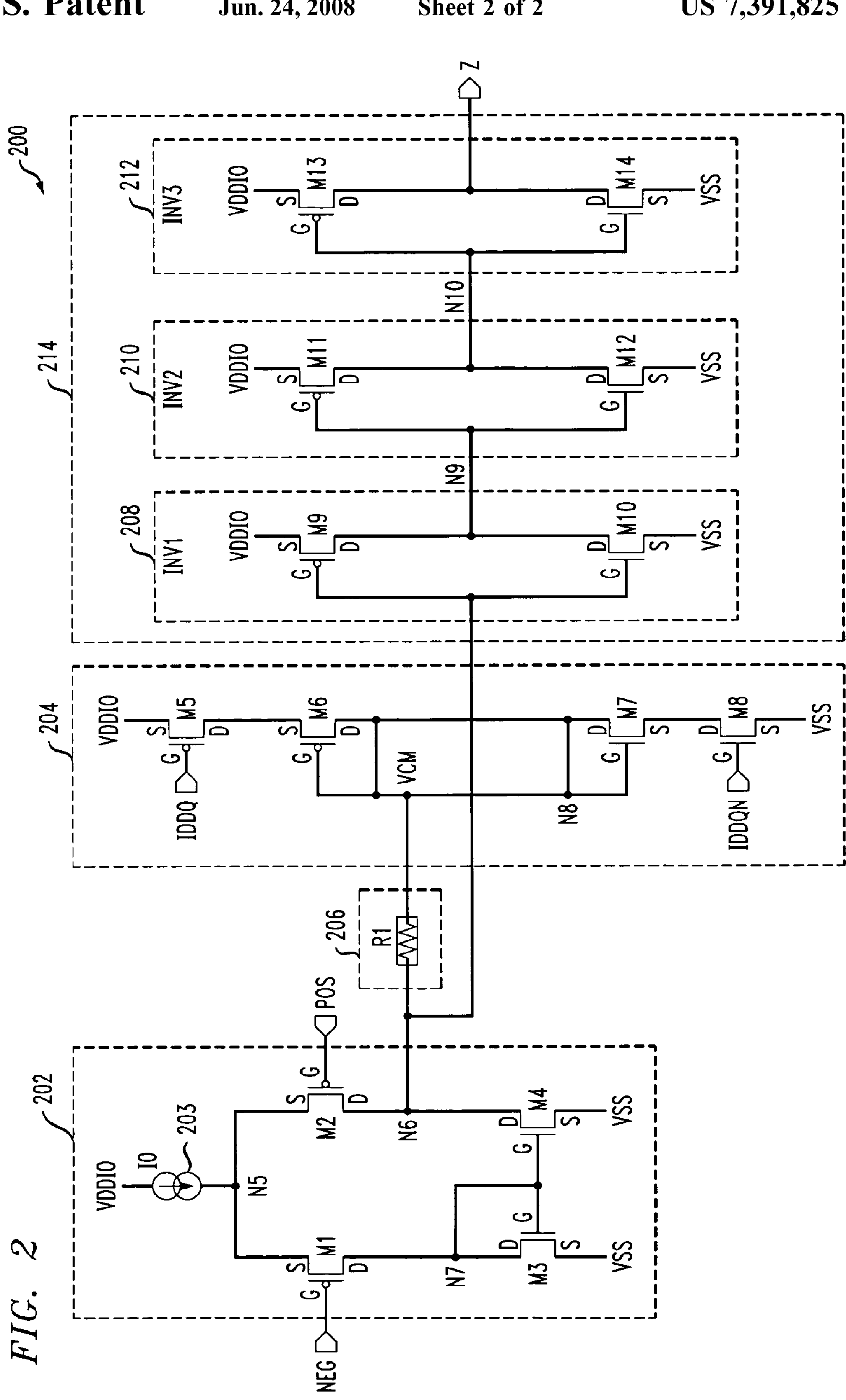
FIG. 2 is a schematic diagram depicting an exemplary comparator circuit, formed in accordance with an illustrative embodiment of the present invention.

FIG. 2 is a schematic diagram depicting an exemplary comparator circuit 200, formed in accordance with an illustrative embodiment of the invention. The exemplary comparator circuit 200 preferably comprises a differential amplifier 202 having first and second inputs forming an inverting input (NEG) and a non-inverting input (POS), respectively, of the comparator circuit, and an output at node N6. Differential amplifier 202, which is merely illustrative, may be implemented in a conventional manner as shown, although it is to be understood that the invention is not limited to this or any particular amplifier configuration. Specifically, amplifier 202 preferably comprises a differential input stage comprising a pair of PMOS input devices M1 and M2. Source terminals of M1 and M2 are connected together to form a common source node N5, and gate terminals of M1 and M2 are connected to the inputs NEG and POS, respectively, of the comparator circuit 200.

The differential amplifier 202 further includes a simple current mirror functioning as an active load for the differential input stage. The current mirror preferably comprises a pair of NMOS devices M3 and M4 configured such that source terminals of M3 and M4 are connected to a first supply voltage VSS, which may be ground, gate and drain terminals of M3 are connected to the drain terminal of M1 at node N7, a gate terminal of M4 is connected to the gate terminal of M3, and a drain terminal of M4 is connected to the drain terminal of M2 at output node N6. Alternative load circuit arrangements (e.g., resistive loads, cascode loads, etc.) suitable for use with the differential amplifier 202 are similarly contemplated.

It is to be appreciated that, because a metal-oxide semiconductor (MOS) device is symmetrical in nature, and thus bidirectional, the assignment of source and drain designations in the MOS device is essentially arbitrary. Therefore, the source and drain terminals may be referred to herein generally as first and second source/drain terminals, respectively, where the term "source/drain" in this context denotes a source terminal or a drain terminal.

A bias generator 203 is included in the differential amplifier 202 for providing a bias current 10 for biasing the differential amplifier to a desired quiescent operating point. Although depicted as an ideal current source, bias generator 203 may, in practice, comprise a PMOS device (not shown) having a source terminal connected to a second supply voltage VDDIO, a drain terminal connected to common source node N5, and a gate terminal for receiving a bias signal. The bias signal may be generated internally by the differential amplifier 202, or may be provided by an external bias source (not shown). Alternative biasing arrangements are similarly contemplated by the present invention. Additionally, by selectively turning off the bias circuit in response to a control signal, such as, for example, during a power-down mode of operation, direct current (DC) power consumption in the differential amplifier 202, and thus in the comparator circuit 200, may be beneficially reduced.

The output node N6 of the differential amplifier 202 is a relatively high impedance node (e.g., greater than about 100 kilo ohms). High output impedance can be undesirable, particularly when driving a small resistance and/or a large capacitance load. A small load resistance requires a large output current in order to provide a correspondingly large output voltage swing. Likewise, a large load capacitance requires a large output current to supply charging currents needed to meet transient response requirements. In order to provide a sufficient output current on a steady-state or transient basis, it is desirable to connect a low-resistance output stage 214 to the output of the differential amplifier 202 at node N6.

The output stage 214 may comprise one or more logic stages. For example, the output stage 214 may include a first inverter 208, a second inverter 210 and a third inverter 212, connected in cascade between the output of the differential amplifier 202 and an output Z of the comparator circuit 200. Specifically, an input of the first inverter 208 is connected to the output of differential amplifier 202 at node N6, an output of inverter 208 is connected to an input of the second inverter 210 at node N9, an output of inverter 210 is connected to an input of the third inverter 212 at node N10, and an output of inverter 212 is connected to the output Z of the comparator circuit 200. Preferably, the first inverter 208 comprises a PMOS device M9 and an NMOS device M10, the second inverter 210 comprises a PMOS device M11 and an NMOS device M12, and the third inverter 212 comprises a PMOS device M13 and an NMOS device M14. For each of the inverters 208, 210, 212, a source terminal of the respective PMOS device is connected to VDDIO, a drain terminal of the PMOS device is connected to a drain terminal of the respective NMOS device to form the output of the inverter, a source terminal of the NMOS device is connected to VSS, and gate terminals of the PMOS and NMOS devices are connected together to form the input of the inverter. Each of the inverters 208, 210, 212, is preferably sized (e.g., by controlling a channel width (W) and/or length (L) of the corresponding PMOS and/or NMOS devices in a given inverter) so as to have a nominal switching point that is about halfway between VDDIO and VSS. The respective switching points of the inverters 208, 210, 212 are preferably substantially matched to one another, although this need not be the case.

As apparent from the figure, the output stage 214 generates an output signal at output Z which is a logical complement of the output signal provided by the differential amplifier 202 at node N6. It is to be understood, however, that the output stage 214 need not provide an inversion of the differential amplifier output signal. Moreover, the output stage 214 is not limited to any particular number of logic stages, or to the use of logic stages exclusively. Output stage 214 is preferably configured to buffer the output of the differential amplifier 202 and to provide a substantially rail-to-rail output signal swing at output Z of the comparator circuit 200, without consuming any significant DC power.

In order to reduce pulse width distortion, the comparator circuit 200 preferably comprises a voltage source 204 connected to the output of the differential amplifier 202 at node N6 via a coupling circuit 206. Although the voltage source 204 and the coupling circuit 206 are depicted as two separate functional blocks, at least a portion of one or more of these blocks may be combined with one or more other functional blocks, in accordance with the invention. By way of example only, and without loss of generality, the coupling circuit 206 may be comprised in the voltage source 204.

In a preferred embodiment of the invention, coupling circuit 206 comprises a resistor R1 connected between the output of the differential amplifier 202 at node N6 and the voltage source 204 at node N8. The resistor R1 preferably has a resistance associated therewith which is high enough in value (e.g., from about 300 ohms to about 10 kilo (K) ohms) so as to provide a desired amount of electrical isolation between the output of the differential amplifier 202 and the voltage source 204. Without some degree of isolation, the output of the differential amplifier 202 at node N6 may not be able to provide a sufficient level of voltage swing, in response to changing input signal levels presented to the comparator circuit 200, to drive the output stage 214. In the preferred embodiment, R1 is about 1 K ohms. The value of resistance chosen for R1 may be a function of the bias current 10 in the differential amplifier 202. For relatively high bias currents (e.g., about 1-2 milliamperes), the resistance should be low (e.g., less than about 1K ohms) so as to be effective in reducing pulse width distortion. For low-bandwidth circuits (e.g., less than about 10 megahertz) that have relatively low bias current 10, the value of R1 could be higher (e.g., about 10 K ohms). Overall, depending on the desired bandwidth of the comparator circuit 200, a preferred range of resistance values for R1 is about 300 to 10 K ohms, although the invention is not limited to any particular resistance value.

Resistor R1 may be formed of essentially any resistive material (e.g., polysilicon, etc.) having a substantially low variation over changes in PVT conditions. Alternative coupling arrangements are similarly contemplated. For instance, in accordance with another aspect of the invention, coupling circuit 206 may be operative to provide a resistance that is selectively variable as a function of a control signal presented thereto. This control signal may be representative, for example, of a desired bandwidth of the comparator circuit 200. By way of example only, coupling circuit 206 may comprise a PMOS or NMOS transistor device (not shown), having a source terminal coupled to node N8 of the voltage source 204, a drain terminal coupled to node N6 of the differential amplifier 202, and a gate terminal for receiving the control signal, as will be understood by those skilled in the art.

Voltage source 204 is preferably operative to generate a voltage VCM at node N8 which is substantially matched to a nominal switching point of the output stage 214 connected to the output of the differential amplifier 202. This voltage VCM may be used to establish a common-mode voltage of the differential amplifier 202, whereby the output signal swing at node N6 in the presence of a switching signal applied to the NEG and/or POS inputs is substantially centered around the switching point of the inverters 208, 210 and 212 (e.g., about VDDIO/2). In a preferred embodiment, the voltage source 204 comprises a voltage divider implemented using active resistors. The voltage source 204 preferably comprises a PMOS transistor device M6 connected to an NMOS transistor device 117, each device being connected in a diode configuration. Specifically, drain and gate terminals of devices M6 and M7 are connected together at node N8 for generating the voltage VCM, a source terminal of M6 is coupled to VDDIO, and a source terminal of M7 is coupled to VSS. Alternative connection arrangements for the active resistor voltage divider are contemplated, as will be understood by those skilled in the art. For example, the gate terminal of at least a given one of devices M6 and M7 may be connected to a bias voltage source (not shown) rather than to the drain terminal of the given device, as in the diode configuration.

The size of at least a given one of devices M6 and M7, which is often represented in terms of a width-to-length ratio (W/L) of the device, may be adjusted to selectively control the voltage drop across the device, and thus control the voltage level of VCM as desired. It is to be understood that the voltage source 204 is not limited to any particular number of active resistors employed. For example, if VCM is chosen to be about one third of the difference between VDDIO and VSS, three active resistor devices may be used, assuming each device is sized to have about the same voltage drop across it. Depending on the voltages chosen for VDDIO and VSS, in order to reduce the amount of area required to implement the active resistors in the voltage divider and to reduce the DC power consumption in the voltage source 204, one or more additional active resistors may be stacked in series with one another so that the voltage drop across any one device is not excessive. Furthermore, devices M6 and M7 are preferably sized such that a ratio of the W/L of M6 to the W/L of M9 is substantially equal to a ratio of the W/L of M7 to the W/L of M10 in order to generate a common-mode voltage VCM which substantially tracks the switching point of the inverters 208, 210, 212, particularly over a desired range of PVT variations.

The respective sizes of devices M6 and M7 in the voltage source 204, as well as the value of resistor R1 in coupling circuit 206, are preferably configured to ensure that the center of the signal swing at node N6 in the presence of a switching signal at the POS and/or NEG input remains as close as possible to the switching point of the inverters 208, 210, 212. In a preferred embodiment of the invention, the W/L of device M6 is substantially equal to the W/L of device M9. Likewise, the W/L of device M7 is substantially equal to the W/L of device M10. To ensure even more accurate tracking between the common-mode voltage VCM generated by the voltage source 204 and the switching point of the inverters 208, 210, 212, device M6 may be formed in close relative proximity of device M9, and device M7 may be formed in close relative proximity to device M10.

A continuous tradeoff between power dissipation and pulse width distortion in the comparator circuit 200 may be realized, for example, by varying the value of the resistor R1 in conjunction with a size of diode connected device M6 and/or M7. Voltage source 204 may also help to diminish an amount of jitter induced in the output of the comparator circuit by differential amplifier 202 by reducing the signal swing at node N6.

The amount of DC power consumption in the voltage source 204 may be reduced by selectively turning off power in the voltage divider, such as during a power-down mode of operation of the comparator circuit 200. This can be accomplished, for example, by optionally adding one or more power-down devices to the voltage source 204, each device being connected between a given one of the active resistor devices (e.g., M6 or M7) and a corresponding voltage supply (e.g., VDDIO or VSS, respectively). Specifically, a PMOS device M5 may be included, having a source terminal connected to VDDIO, a drain terminal connected to the source terminal of M6, and a gate terminal receiving a first control signal IDDQ. Likewise, an NMOS device M8 may be included, having a source terminal connected to VSS, a drain terminal connected to the source terminal of M7, and a gate terminal receiving a second control signal IDDQN, which may be a logical complement of the first control signal IDDQ. Each of devices M5 and M8 preferably has an on-resistance associated therewith which is substantially less than a resistance of the active resistor devices M6 and M7.

Various alternative circuit configurations for the voltage source 204 which are suitable for use with the present invention are contemplated, although the invention is not limited to any particular circuit configuration. For instance, the positions of devices M5 and M6 in the voltage divider stack may be swapped relative to one another, with essentially no significant effect on the operation of the voltage source 204. Likewise, the positions of devices M7 and M8 in the voltage divider stack may be swapped relative to one another. Thus, in accordance with an alternative embodiment of the invention (not shown), the voltage divider in the voltage source 204 may be arranged such that the source terminal of M6 is connected to VDDIO, the source terminal of M5 is connected to the gate and drain terminals of M6, the drain terminal of M5 is connected to the drain terminal of M8, the source terminal of M8 is connected to the drain and gate terminals of M7, and the source terminal of M7 is connected to VSS.

It is to be appreciated that the techniques of the present invention for reducing pulse width distortion in comparator circuit 200 may be implemented using alternative circuit configurations. For example, although not shown, in the differential amplifier 202, PMOS devices may be substituted for the NMOS devices M3 and M4, and NMOS devices may be substituted for the PMOS devices M1 and M2, while flipping the respective polarities of the voltage supplies VDDIO and VSS, with essentially no significant change in the operation of the comparator circuit, as will be understood by those skilled in the art. Additionally, although VDDIO is preferably about 3.3 volts and VSS is about zero volts, the invention is not limited to any particular voltage levels for VDDIO and VSS. For example, VDDIO may be about zero volts and VSS may be about −3.3 volts.

At least a portion of the comparator circuit of the present invention may be implemented in an integrated circuit. In forming integrated circuits, a plurality of identical die is typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A comparator circuit having reduced pulse width distortion, the comparator circuit comprising:

a differential amplifier operative to receive at least first and second signals and to amplify a difference between the at least first and second signals, the differential amplifier generating a difference signal at an output thereof which is a function of the difference between the at least first and second signals;

an output stage for receiving the difference signal and for generating an output signal of the comparator circuit, the output signal being representative of the difference signal, the output stage having a switching point associated therewith; and a voltage source coupled to the output of the differential amplifier and operative to generate a reference signal for establishing a common-mode voltage of the difference signal generated by the differential amplifier, the reference signal being substantially centered about the switching point of the output stage and substantially tracking the switching point over variations in at least one of process, voltage and temperature conditions to which the comparator circuit is subjected.

2. The circuit of claim 1, wherein the voltage source comprises at least first and second transistors, each of the first and second transistors being connected in a diode configuration, the first transistor being connected between a first voltage supply and the second transistor, the second transistor being connected between a second voltage supply and the first transistor, the reference signal being generated at a junction between the first and second transistors.

3. The circuit of claim 1, wherein the voltage source is selectively operable in one of at least two modes in response to a control signal, wherein in the first mode the voltage source is operative to generate the reference signal, and in the second mode at least a portion of the voltage source is turned off.

4. The circuit of claim 1, wherein the voltage source comprises first and second PMOS devices and first and second NMOS devices, a first source/drain terminal of the first PMOS device connecting to a first source providing a first voltage, a second source/drain, terminal of the first PMOS device being connected to a first source/drain terminal of the second PMOS device, a gate terminal of the first PMOS device receiving a first control signal, a second source/drain terminal of the second PMOS device being connected to a gate terminal of the second PMOS device, a first source/drain terminal of the first NMOS device being connected to the gate terminal of the second PMOS device, a second source/drain terminal of the first NMOS device being connected to a first source/drain terminal of the second NMOS device, a gate terminal of the first NMOS device being connected to the first source/drain terminal of the first NMOS device, a second source/drain terminal of the second NMOS device connecting to a second source providing a second voltage, and a gate terminal of the second NMOS device receiving a second control signal.

5. The circuit of claim 4, wherein the second control signal is a logical complement of the first control signal.

6. The circuit of claim 1, wherein the voltage source is coupled to the output of the differential amplifier via a resistor having a resistance value selected so as to provide a desired amount of electrical isolation between the voltage source and the differential amplifier.

7. The circuit of claim 6, wherein the resistance value is in a range from about 300 ohms to about 10,000 ohms.

8. The circuit of claim 1, wherein the voltage source is coupled to the output of the differential amplifier via a resistor, a signal swing of the difference signal generated by the differential amplifier being controlled at least in part as a function of a resistance value of the resistor.

9. The circuit of claim 1, wherein:

the voltage source comprises a PMOS device and an NMOS device, each of the PMOS and NMOS devices being connected in a diode configuration, a first source/drain terminal of the PMOS device connecting to a first source providing a first voltage, a first source/drain terminal of the NMOS device connecting to a second source providing a second voltage, and gate terminals and second source/drain terminals of the PMOS and NMOS devices being connected together and generating the reference signal;

the output stage comprises at least a first inverter including a PMOS device and an NMOS device, a first source/drain terminal of the PMOS device connecting to the first source, a first source/drain terminal of the NMOS device connecting to the second source, gate terminals of the PMOS and NMOS device being connected to the output of the differential amplifier, and second source/drain terminals of the PMOS and NMOS devices being connected together and generating an output of the comparator circuit; and a ratio of a size of the PMOS device in the voltage source to a size of the PMOS device in the first inverter being substantially equal to a ratio of a size of the NMOS device in the voltage source to a size of the NMOS device in the first inverter.

10. The circuit of claim 1, wherein the differential amplifier comprises a differential input stage configured for receiving the at least first and second signals, a resistive load coupled to the differential input stage, and a bias circuit coupled to the differential input stage for providing a current for biasing the differential amplifier to a desired quiescent operating point.

11. The circuit of claim 1, wherein the differential amplifier comprises:

first and second PMOS devices and first and second NMOS devices, first source/drain terminals of the first and second PMOS devices being connected together to form a common source node, a gate terminal of the first PMOS device receiving the first signal, a gate terminal of the second PMOS device receiving the second signal, a second source/drain terminal of the first PMOS device being connected to a first source/drain terminal of the first NMOS device, a second source/drain terminal of the second PMOS device being connected to a first source/drain terminal of the second NMOS device, second source/drain terminals of the first and second NMOS devices connecting to a first source providing a first voltage, and gate terminals of the first and second NMOS devices being connected to the first source/drain terminal of the first NMOS device; and a bias circuit connected to the common source node, the bias circuit providing a bias current for biasing the differential amplifier to a desired quiescent operating point.

12. The circuit of claim 11, wherein the bias circuit in the differential amplifier is selectively operable in one of at least two modes in response to a control signal, wherein in the first mode the bias circuit is operable to generate the bias current, and in the second mode at least a portion of the bias circuit is turned off.

13. The circuit of claim 1, wherein the voltage source is coupled to the output of the differential amplifier via an NMOS device, a first source/drain terminal of the NMOS device being connected to the differential amplifier, a second source/drain terminal of the NMOS device being connected to the voltage source, and a gate terminal of the NMOS receiving a control signal, a resistance value of the NMOS device being selectively controlled as a function of the control signal so as to provide a desired amount of electrical isolation between the voltage source and the differential amplifier.

14. The circuit of claim 1, wherein the voltage source is coupled to the output of the differential amplifier via a PMOS device, a first source/drain terminal of the PMOS device being connected to the differential amplifier, a second source/drain terminal of the PMOS device being connected to the voltage source, and a gate terminal of the PMOS receiving a control signal, a resistance value of the PMOS device being selectively controlled as a function of the control signal so as to provide a desired amount of electrical isolation between the voltage source and the differential amplifier.

15. The circuit of claim 1, wherein the voltage source is coupled to the differential amplifier via a coupling circuit operative to provide a resistance that is selectively variable as a function of a control signal presented thereto so as to provide a desired amount of electrical isolation between the voltage source and the differential amplifier.

16. An integrated circuit including at least one comparator circuit, the at least one comparator circuit comprising:

a differential amplifier operative to receive at least first and second input signals applied to the comparator circuit and to amplify a difference between the at least first and second input signals, the differential amplifier generating a difference signal at an output thereof which is a function of the difference between the at least first and second input signals;

an output stage for receiving the difference signal and for generating an output signal of the comparator circuit, the output signal being representative of the difference signal, the output stage having a switching point associated therewith; and a voltage source coupled to the output of the differential amplifier operative to generate a reference signal for establishing a common-mode voltage of the difference signal generated by the differential amplifier, the reference signal being substantially centered about the switching point of the output stage and substantially tracking the switching point over variations in at least one of process, voltage and temperature conditions to which the comparator circuit is subjected.

17. The integrated circuit of claim 16, wherein the voltage source is selectively operable in one of at least two modes in response to a control signal, wherein in the first mode the voltage source is operative to generate the reference signal, and in the second mode at least a portion of the voltage source is turned off.

18. The integrated circuit of claim 16, wherein the voltage source comprises first and second PMOS devices and first and second NMOS devices, a first source/drain terminal of the first PMOS device connecting to a first source providing a first voltage, a second source/drain terminal of the first PMOS device being connected to a first source/drain terminal of the second PMOS device, a gate terminal of the first PMOS device receiving a first control signal, a second source/drain terminal of the second PMOS device being connected to a gate terminal of the second PMOS device, a first source/drain terminal of the first NMOS device being connected to the gate terminal of the second PMOS device, a second source/drain terminal of the first NMOS device being connected to a first source/drain terminal of the second NMOS device, a gate terminal of the first NMOS device being connected to the first source/drain terminal of the first NMOS device, a second source/drain terminal of the second NMOS device connecting to a second source providing a second voltage, and a gate terminal of the second NMOS device receiving a second control signal.

19. The integrated circuit of claim 16, wherein the voltage source is coupled to the output of the differential amplifier via a resistor having a resistance value selected so as to provide a desired amount of electrical isolation between the voltage source and the differential amplifier.

20. The integrated circuit of claim 16, wherein:

the voltage source comprises a PMOS device and an NMOS device, each of the PMOS and NMOS devices being connected in a diode configuration, a first source/drain terminal of the PMOS device connecting to a first source providing a first voltage, a first source/drain terminal of the NMOS device connecting to a second source providing a second voltage, and gate terminals and second source/drain terminals of the PMOS and NMOS devices being connected together and generating the reference signal;

the output stage comprises at least a first inverter including a PMOS device and an NMOS device, a first source/drain terminal of the PMOS device connecting to the first source, a first source/drain terminal of the NMOS device connecting to the second source, gate terminals of the PMOS and NMOS device being connected to the output of the differential amplifier, and second source/drain terminals of the PMOS and NMOS devices being connected together and generating an output of the comparator circuit; and a ratio of a size of the PMOS device in the voltage source to a size of the PMOS device in the first inverter being substantially equal to a ratio of a size of the NMOS device in the voltage source to a size of the NMOS device in the first inverter.

* * * * *